(12) United States Patent
Kim et al.

(10) Patent No.: US 7,724,864 B2
(45) Date of Patent: May 25, 2010

(54) SHIFT REGISTER AND DISPLAY DEVICE HAVING THE SAME

(75) Inventors: Beom-Jun Kim, Seoul (KR); Yu-Jin Kim, Asan-si (KR); Byeong-Jae Ahn, Seoul (KR); Bong-Jun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 11/498,574

(22) Filed: Aug. 3, 2006

(65) Prior Publication Data

US 2007/0040793 A1 Feb. 22, 2007

(30) Foreign Application Priority Data

Aug. 8, 2005 (KR) .................. 10-2005-0072067

(51) Int. Cl.
*G11C 19/00* (2006.01)
(52) U.S. Cl. .............................. 377/64; 377/68; 377/70; 377/74
(58) Field of Classification Search ........................ None
See application file for complete search history.

(56) References Cited

U.S. PATENT DOCUMENTS

| | | | | |
|---|---|---|---|---|
| 5,949,271 A * | 9/1999 | Fujikura | ..................... | 327/390 |
| 5,949,398 A * | 9/1999 | Kim | ........................... | 345/100 |
| 6,778,627 B2 * | 8/2004 | Yu | ............................... | 377/72 |
| 7,317,780 B2 * | 1/2008 | Lin et al. | ....................... | 377/67 |
| 7,403,586 B2 * | 7/2008 | Tobita et al. | ................... | 377/64 |
| 2005/0008114 A1 * | 1/2005 | Moon | ........................... | 377/64 |
| 2005/0220262 A1 * | 10/2005 | Moon | ........................... | 377/64 |
| 2006/0291610 A1 * | 12/2006 | Lo et al. | ...................... | 377/64 |

\* cited by examiner

*Primary Examiner*—Tuan Lam
(74) *Attorney, Agent, or Firm*—F. Chau & Associates, LLC

(57) ABSTRACT

A shift register includes a plurality of stages to output a plurality of output signals, in sequence. Each of the stages includes a driving part and a discharging part. The driving part outputs an output signal of a present stage based on one of a start signal and an output signal of a previous stage, and a clock signal. The discharging part discharges the output signal of the present stage. The discharging part includes a discharge transistor and an auxiliary transistor. The discharge transistor has a gate electrode receiving an output signal of a next stage. The auxiliary transistor has a gate electrode receiving the output signal of the next stage. The auxiliary transistor is electrically connected in series to the discharge transistor. Therefore, the chance of a malfunction is decreased, and image display quality of the display device is improved.

18 Claims, 11 Drawing Sheets

SHIFT REGISTER AND DISPLAY DEVICE HAVING THE SAME

CROSS-REFERENCE TO RELATED APPLICATIONS

The present application claims priority from Korean Patent Application No. 2005-72067, filed on Aug. 8, 2005, the disclosure of which is hereby incorporated herein by reference in its entirety.

BACKGROUND OF THE INVENTION

1. Technical Field

The present disclosure relates to a shift register and a display device having the shift register. More particularly, the present invention relates to a shift register capable of decreasing malfunction and a display device using the shift register to improve image display quality.

2. Discussion of the Related Art

A display device, in general, includes a display panel, a gate driving circuit and a data driving circuit. The display panel includes an array substrate and an opposite substrate. The array substrate includes a plurality of gate lines, a plurality of data lines and a plurality of switching elements. The opposite substrate faces the array substrate. The gate driving circuit includes a plurality of thin film transistors, and applies a gate signal to the gate lines. The data driving circuit applies a data signal to the data lines.

The gate driving circuit and the switching elements are formed through a photolithography process. A short circuit between source and drain electrodes of one of the thin film transistors can be caused by poor etching, a particle, etc., so that the thin film transistor of the gate driving circuit, the data driving circuit, the switching elements, etc., can malfunction. In addition, when a high voltage is applied to one of the thin film transistors, the thin film transistor often malfunctions.

When the thin film transistor of the gate driving circuit, the data driving circuit, the switching elements, etc., malfunction, the overall image display quality of a display device is deteriorated.

SUMMARY OF THE INVENTION

Exemplary embodiments of the present invention provide a shift register capable of reducing the chance of a malfunction, and a display device having the above-mentioned shift register to improve image display quality.

A shift register in accordance with an embodiment of the present invention includes a plurality of stages to output a plurality of output signals, in sequence. Each of the stages includes a driving part and a discharging part. The driving part outputs an output signal of a present stage based on one of a start signal and an output signal of a previous stage, and a clock signal. The discharging part discharges the output signal of the present stage. The discharging part includes a discharge transistor and an auxiliary transistor. The discharge transistor has a gate electrode receiving an output signal of a next stage. The auxiliary transistor has a gate electrode receiving the output signal of the next stage. The auxiliary transistor is electrically connected to the discharge transistor in series.

A shift register in accordance with an embodiment of the present invention includes a plurality of stages to output sequentially a plurality of output signals. Each of the stages includes a driving part and a discharging part. The driving part outputs an output signal of a present stage based on one of a start signal and an output signal of a previous stage, and one of a first clock signal and a second clock signal has a substantially opposite phase to the first clock signal. The discharging part discharges the output signal of the present stage. The discharging part includes a discharge transistor and an auxiliary transistor. The discharge transistor has a gate electrode receiving an output signal of a next stage. The auxiliary transistor has a gate electrode receiving the output signal of the next stage. The auxiliary transistor is electrically connected to the discharge transistor in series.

A shift register in accordance with an embodiment of the present invention includes a plurality of stages to output a plurality of output signals, in sequence. Each of the stages includes a driving part and a discharging part. The driving part includes a switching transistor and an auxiliary transistor electrically connected in series to the switching transistor to output a signal of a present stage based on one of a start signal and an output signal of a previous stage, and one of a first clock signal and a second clock signal having a substantially opposite phase to the first clock signal. The discharging part discharges the output signal of the present stage based on an output signal of a next stage.

A display device in accordance with an embodiment of the present invention includes a display panel, a gate driving circuit and a data driving circuit. The display panel includes a plurality of gate lines, a plurality of data lines and a plurality of pixels electrically connected to the gate and data lines. The gate driving circuit includes a plurality of stages directly formed on the display panel to output sequentially a plurality of output signals to the gate lines. Each of the stages includes a driving part and a discharging part. The driving part outputs an output signal of a present stage based on one of a start signal and an output signal of a previous stage, and a clock signal. The discharging part discharges the output signal of the present stage. The discharging part includes a discharge transistor and an auxiliary transistor. The discharge transistor has a gate electrode receiving an output signal of a next stage. The auxiliary transistor has a gate electrode receiving the output signal of the next stage. The auxiliary transistor is electrically connected to the discharge transistor in series. The data driving circuit applies a plurality of data signals to the data lines.

The first and second electrodes of the transistor are source and drain electrodes, respectively. Alternatively, the first and second electrodes of the transistor may be the drain and source electrodes.

According to exemplary embodiments of the present invention, each of the stages includes an auxiliary transistor, so that the stage functions normally, even though the switching transistor electrically connected to the auxiliary transistor malfunctions. Therefore, the malfunction of the gate driving circuit is decreased to improve image display quality. In addition, an electric power applied to the switching transistor is divided between the switching transistor and the auxiliary transistor to increase the lifetime of the switching transistor and to stabilize operation of the stage.

BRIEF DESCRIPTION OF THE DRAWINGS

Exemplary embodiments of the present invention can be understood in more detail from the following descriptions taken in conjunction with reference to the accompanying drawings, in which.

DESCRIPTION OF THE EMBODIMENTS

Figure 1:
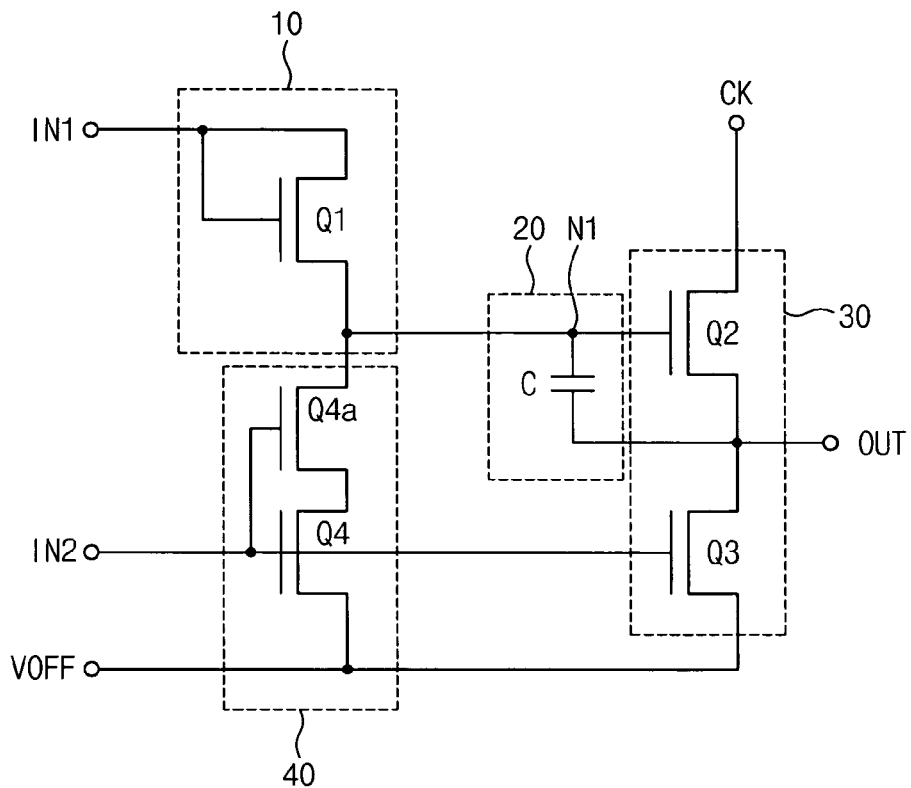
FIG. 1 is a circuit diagram illustrating a stage in accordance with an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a circuit diagram illustrating a stage in accordance with one embodiment of the present invention.

Referring to FIG. 1, the stage includes a buffering part 10, a charging part 20, a driving part 30 and a discharging part 40. The stage applies a gate signal (or a scan signal) to a gate line of a liquid crystal display (LCD) device based on a scan start signal or an output signal of a previous stage. In FIG. 1, first and second electrodes of a transistor are the source and drain electrodes of the transistor, respectively. Alternatively, the first and second electrodes of the transistor may be the drain and source electrodes of the transistor, respectively.

The buffering part 10 includes a first transistor Q1. A gate electrode of the first transistor Q1 is electrically connected to a first electrode of the first transistor Q1 and to a first input terminal IN1. When the stage is a first stage of a shift register, the scan start signal is applied to the first input terminal IN1. When the stage is not the first stage of the shift register, the output signal of the previous stage is applied to the first input terminal IN1. A second electrode of the first transistor Q1 is electrically connected to a first node N1.

The charging part 20 includes a capacitor C. A first storage electrode of the capacitor C is electrically connected to the first node N1, the second electrode of the first transistor Q1 and the discharging part 40. A second storage electrode of the capacitor C is electrically connected to the driving part 30.

The driving part 30 includes a second transistor Q2 and a third transistor Q3.

A first electrode of the second transistor Q2 is electrically connected to a clock terminal CK. A first clock signal is applied to the clock terminal CK of each odd-numbered stage, and a second clock signal is applied to the clock terminal CK of each even-numbered stage. A gate electrode of the second transistor Q2 is electrically connected to the first storage electrode of the capacitor C, the second electrode of the first transistor Q1 and the discharging part 40 at the first node N1. A second electrode of the second transistor Q2 is electrically connected to the second storage electrode of the capacitor C and an output terminal OUT of the present stage.

A gate electrode of the third transistor Q3 is electrically connected to a second input terminal IN2. An output signal of the next stage is applied to the second input terminal IN2. A first electrode of the third transistor Q3 is electrically connected to the second storage electrode of the capacitor C, the second electrode of the second transistor Q2 and the output terminal OUT of the present stage. A second electrode of the third transistor Q3 is electrically connected to an off-voltage terminal VOFF.

The discharging part 40 includes a fourth transistor Q4 and an auxiliary transistor Q4a. A gate electrode of the fourth transistor Q4 is electrically connected to the second input terminal IN2. A first electrode of the fourth transistor Q4 is electrically connected to the auxiliary transistor Q4a. A second electrode of the fourth transistor Q4 is electrically connected to the off-voltage terminal VOFF and the second electrode of the third transistor Q3.

A gate electrode of the auxiliary transistor Q4a is electrically connected to the second input terminal IN2 and the gate electrode of the fourth transistor Q4. A first electrode of the fourth transistor Q4 is electrically connected to the second electrode of the first transistor Q1, the first storage electrode of the capacitor C and the gate electrode of the second transistor Q2 at the first node N1. A second electrode of the auxiliary transistor Q4a is electrically connected to the first electrode of the fourth transistor Q4. That is, the auxiliary transistor Q4a is electrically connected in series to the fourth transistor Q4.

Figure 2:
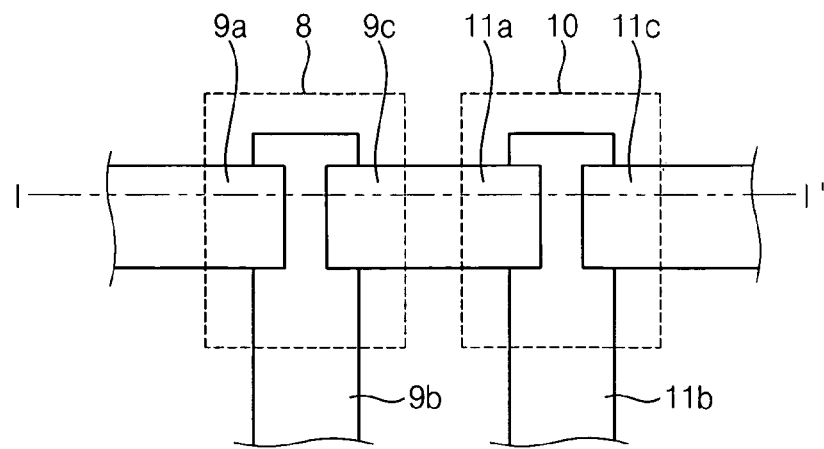
FIG. 2 is a plan view illustrating a fourth transistor and an auxiliary transistor shown in FIG. 1.
Figure 3:
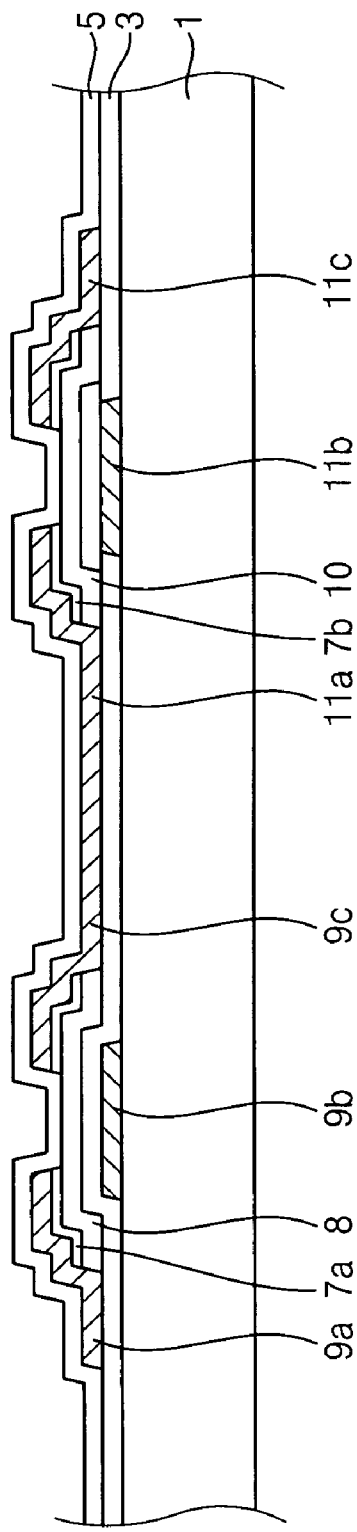
FIG. 3 is a cross-sectional view taken along a line I-I' shown in FIG. 2.

FIG. 2 is a plan view illustrating a fourth transistor and an auxiliary transistor shown in FIG. 1. FIG. 3 is a cross-sectional view taken along a line I-I' shown in FIG. 2.

Referring to FIGS. 2 and 3, the fourth transistor Q4 and the auxiliary transistor Q4a are formed on an insulating substrate 1. The fourth transistor Q4 includes the gate electrode 9b, the first electrode 9c, the second electrode 9a, a channel layer 8 and an N+ amorphous silicon layer 7a (as an ohmic contact layer). The auxiliary transistor Q4a includes the gate electrode 11b, the first electrode 11c, the second electrode 11a, a channel layer 10 and an N+ amorphous silicon layer 7b (as an ohmic contact layer).

The gate electrode 9b of the fourth transistor Q4 and the gate electrode 11b of the auxiliary transistor Q4a are formed on the insulating substrate 1. A first insulating layer 3 is formed on the insulating substrate 1 having the gate electrode 9b of the fourth transistor Q4 and the gate electrode 11b of the auxiliary transistor Q4a, so that the gate electrode 9b of the fourth transistor Q4 and the gate electrode 11b of the auxiliary transistor Q4a are electrically insulated from the first electrode 9c of the fourth transistor Q4, the second electrode 9a of the fourth transistor Q4, the channel layer 8 of the fourth transistor Q4, the N+ amorphous silicon layer 7a of the fourth transistor Q4, the first electrode 11c of the auxiliary transistor Q4a, the second electrode 11a of the auxiliary transistor Q4a, the channel layer 10 of the auxiliary transistor Q4a and the N+ amorphous silicon layer 7b of the auxiliary transistor Q4a.

The channel layer 8 of the fourth transistor Q4 and the channel layer 10 of the auxiliary transistor Q4a are formed on the first insulating layer 3 corresponding to the gate electrode 9b of the fourth transistor Q4 and the gate electrode 11b of the auxiliary transistor Q4a. In FIGS. 1 to 3, each channel layer 8 of the fourth transistor Q4 and the channel layer 10 of the auxiliary transistor Q4a includes amorphous silicon. Alternatively, each channel layer 8 of the fourth transistor Q4 and the channel layer 10 of the auxiliary transistor Q4a may include poly-silicon.

The N+ amorphous silicon layer 7a of the fourth transistor Q4 is formed on the channel layer 8 of the fourth transistor Q4, and includes two N+ amorphous silicon patterns spaced apart from each other. The N+ amorphous silicon layer 7b of the auxiliary transistor Q4a is formed on the channel layer 10 of the auxiliary transistor Q4a, and includes two N+ amorphous silicon patterns spaced apart from each other. The first and second electrodes 9c and 9a of the fourth transistor Q4 are formed on the first insulating layer 3 having the N+ amorphous silicon layer 7a of the fourth transistor Q4. The first and second electrodes 9c and 9a are spaced apart from each other. The first and second electrodes 11c and 11a of the auxiliary transistor Q4a are formed on the first insulating layer 3 having the N+ amorphous silicon layer 7b of the auxiliary transistor Q4a. The first and second electrodes 11c and 11a are spaced apart from each other.

A second insulating layer 5 is formed on the first insulating layer 3 having the first and second electrodes 9c and 9a of the fourth transistor Q4, the first and second electrodes 11c and 11a of the auxiliary transistor Q4a and the channel layers 8 and 10.

In FIGS. 1 to 3, the channel layer 8 that is exposed between the first and second electrodes 9c and 9a of the fourth transistor Q4 has a substantially I-shape. In addition, the channel layer 10 that is exposed between the first and second electrodes 11c and 11a of the auxiliary transistor Q4a has a substantially I-shape. The fourth transistor Q4 and the auxiliary transistor Q4a may be adjacent to a corner of the stage.

Figure 4:
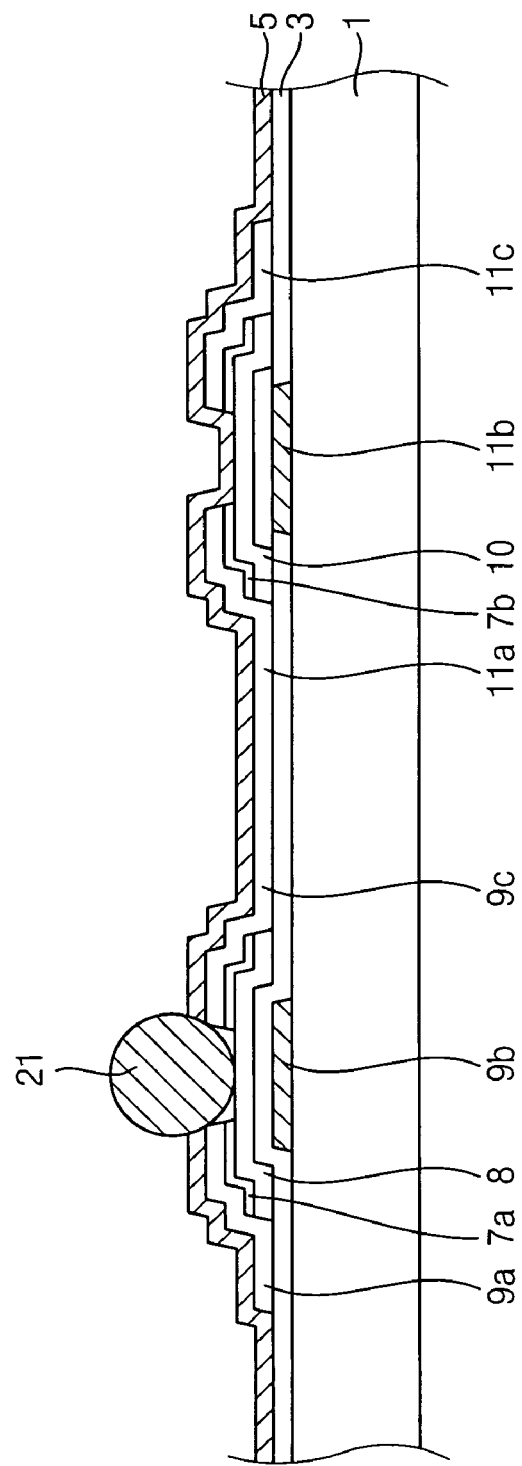
FIG. 4 is a cross-sectional view illustrating a particle on the fourth transistor shown in FIG. 3.

FIG. 4 is a cross-sectional view illustrating an unwanted particle on the fourth transistor shown in FIG. 3. In FIG. 4, the particle includes a conductive material.

Referring to FIG. 4, the first electrode 9c of the fourth transistor Q4 is short-circuited with the second electrode 9a of the fourth transistor Q4 through the conductive particle 21. When the first electrode 9c of the fourth transistor Q4 is short-circuited with the second electrode 9a of the fourth transistor Q4, the fourth transistor Q4 may malfunction, so that the first electrode 9c of the fourth transistor Q4 is electrically connected to the second electrode 9a of the fourth transistor Q4 although an electric signal is not applied to the gate electrode 9b of the fourth transistor Q4 and the gate electrode 11b of the auxiliary transistor Q4a. However, when the electric signal is not applied to the gate electrode 11b of the auxiliary transistor Q4a, a current will not flow through the first and second electrodes 11c and 11a of the auxiliary transistor Q4a.

Therefore, the discharging part 40 normally performs a discharging function, although the fourth transistor Q4 is short-circuited.

Referring again to FIG. 1, in operation, when the scan start signal or the output signal of the previous stage is applied to the first transistor Q1 through the first input terminal IN1, the scan start signal or the output signal of the previous stage is charged in the capacitor C through the first transistor Q1.

When the scan start signal or the output signal of the previous stage is charged in the capacitor C, the second transistor Q2 is turned on. When the second transistor Q2 is turned on, the clock signal that is applied to the first electrode of the second transistor Q2 is applied to the output terminal OUT of the present stage through the channel 8 (shown in FIG. 2) of the second transistor Q2. Therefore, the output signal of the present stage is outputted through the output terminal OUT.

When the output signal of the next stage is applied to the gate electrode of the third transistor Q3, the gate electrode of the fourth transistor Q4 and the gate electrode of the auxiliary transistor Q4a through the second input terminal IN2, the fourth transistor Q4 and the auxiliary transistor Q4a are turned on, so that the electric charge stored in the capacitor C is discharged through the channel layer of the third transistor Q3 and the off-voltage terminal VOFF.

According to the stage shown in FIGS. 1 to 3, the stage includes the auxiliary transistor Q4a, so that the discharging part 40 normally functions, although the fourth transistor Q4 malfunctions. In addition, an electric power applied to the discharging part 40 is divided between the fourth transistor Q4 and the auxiliary transistor Q4a to increase a lifetime of the fourth transistor Q4.

Figure 5:
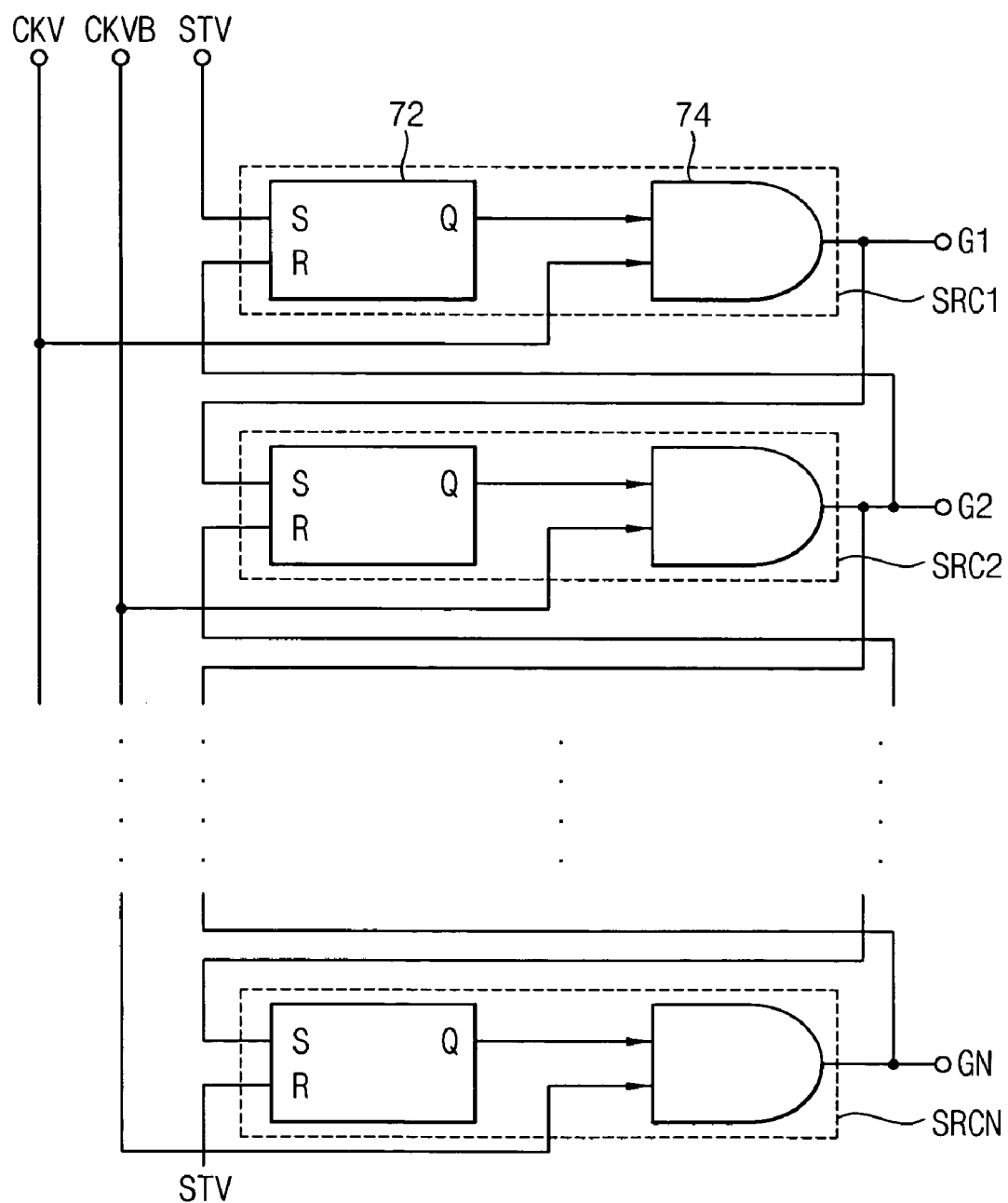
FIG. 5 is a plan view illustrating a shift register having the stage shown in FIG. 1.

FIG. 5 is a plan view illustrating a shift register having the stage shown in FIG. 1.

Referring to FIG. 5, the shift register includes first, second, . . . N-th stages SRC1, SRC2, . . . SRCN.

One S-R latch 72 and one AND-gate 74 may represent each of the stages SRC1, SRC2, . . . SRCN.

The scan start signal STV is applied to the first stage SRC1. The first clock signal CKV is applied to the odd-numbered stages SRC1, SRC3, . . . SRCN−1. The second clock signal CKVB is applied to the even-numbered stages SRC2, SRC4, . . . SRCN.

In operation, each of the stages SRC1, SRC2, . . . SRCN of the shift register is activated by the output signal of the previous stage, and deactivated by the output signal of the next stage. When the S-R latch 72 is activated and the clock signal that is applied through the clock terminal CK is a high level, the AND gate 74 applies the output signal of the present stage to one of first, second, . . . N-th gate lines. The clock signal is one of the first clock CKV1 and the second clock CKB1. That is, the stages SRC1, SRC2, . . . SRCN apply the output signals G1, G2, . . . GN of the first, second, . . . N-th stages SRC1, SRC2, . . . SRCN to the first, second, . . . N-th gate lines, in sequence. The output signals G1, G2, . . . GN of the first, second, . . . N-th stages SRC1, SRC2, . . . SRCN are first, second, . . . N-th gate signals.

Figure 6:
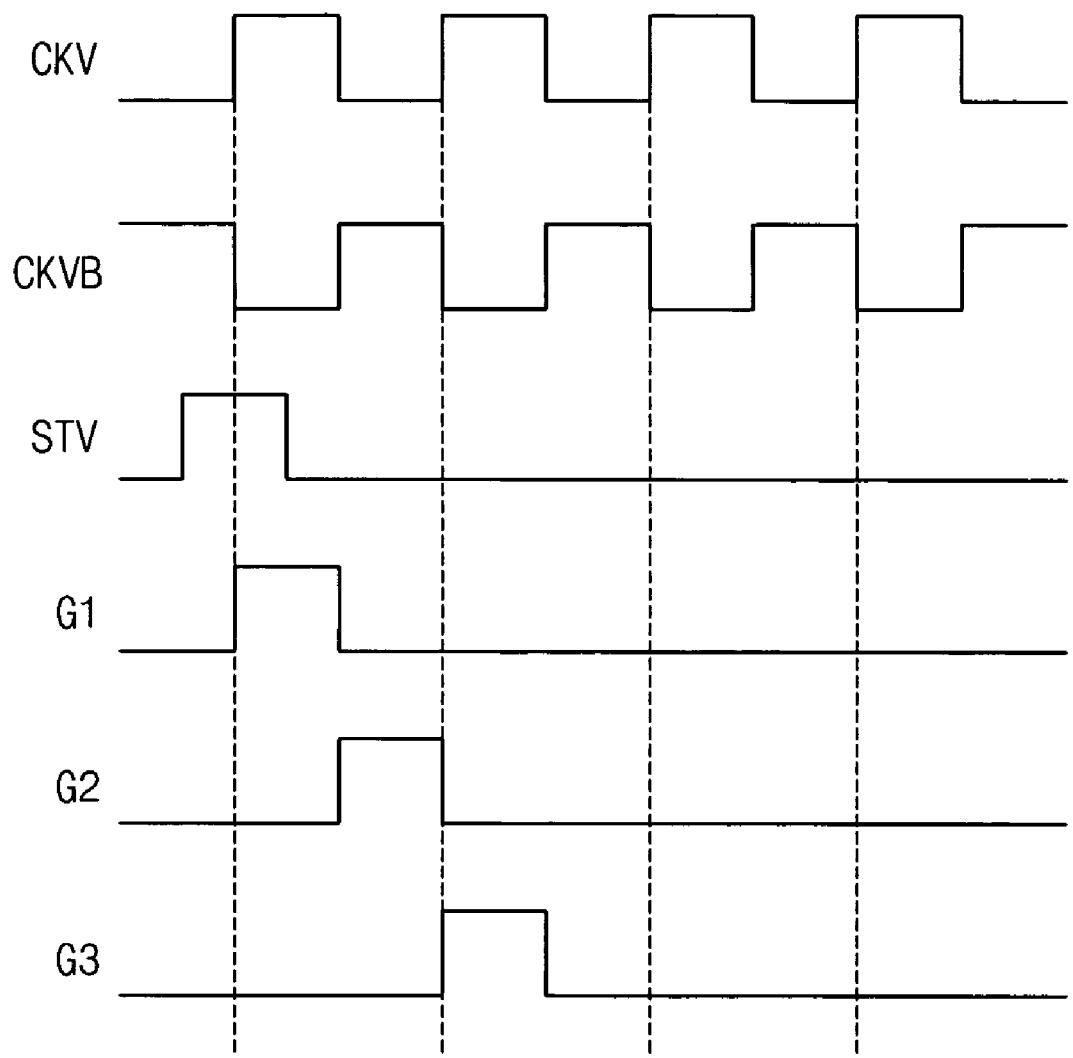
FIG. 6 is a timing diagram illustrating signals of the shift register shown in FIG. 5.

FIG. 6 is a timing diagram illustrating signals of the shift register shown in FIG. 5.

Referring to FIGS. 5 and 6, the first clock signal CKV has a substantially opposite phase to the second clock signal CKVB. The scan start signal STV has a high level in an initial stage of each frames. The first, second, . . . N-th gate signals are applied to the first, second, . . . N-th gate lines, in sequence.

Figure 7:
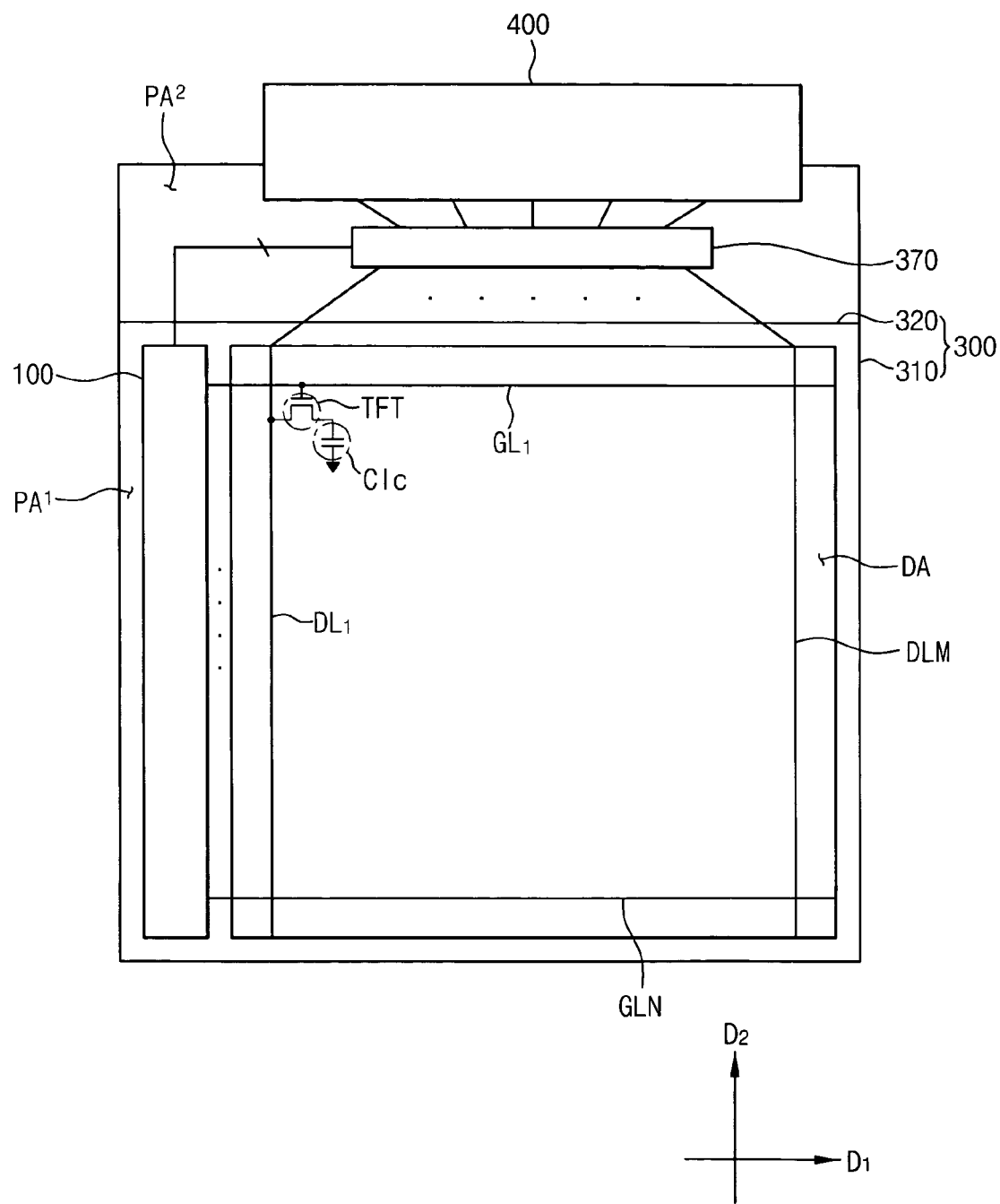
FIG. 7 is a plan view illustrating a display device having the shift register shown in FIG.

FIG. 7 is a plan view illustrating a display device having the shift register shown in FIG. 5.

Referring to FIGS. 5 and 7, the display device 500 includes a gate driving circuit 100, a display panel 300, a data driving circuit 370 and a flexible circuit board 400.

The display panel 300 includes a first substrate 310, a second substrate 320 and a liquid crystal layer (not shown). The second substrate 320 faces the first substrate 310. The liquid crystal layer (not shown) is interposed between the first and second substrates 310 and 320.

The first substrate 310 includes a display region DA, a first peripheral region PA1 and a second peripheral region PA2. The image is displayed in the display region DA. The first and second peripheral regions PA1 and PA2 are adjacent to the display region DA. The first peripheral region PA1 is on a side of the first substrate 310, and the second peripheral region PA2 is adjacent to the first peripheral region PA1 on another side of the first substrate 310.

The first substrate 310 includes a plurality of gate lines GL1, GL2, . . . GLN, a plurality of data lines DL1, DL2, . . . DLM, a plurality of pixel thin film transistors TFT and a plurality of liquid crystal capacitors Clc in the display region DA.

The gate lines GL1, GL2, . . . GLN are extended in a first direction D1. The gate lines are electrically connected to the output terminals of the stages of the gate driving circuit 100 in the first peripheral region PA1. The data lines DL1, DL2, . . . DLM cross the gate lines GL1, GL2, . . . GLN, and are extended in a second direction D2 that is substantially perpendicular to the first direction D1. The data lines DL1, DL2, . . . DLM are electrically insulated from the gate lines GL1, GL2, . . . GLN. The data lines DL1, DL2, . . . DLM are electrically connected to the data driving circuit 370 in the second peripheral region PA2. The gate and data lines GL1, GL2, . . . GLN and DL1, DL2, . . . DLM define a plurality of pixel regions. The pixel regions are arranged in a matrix shape.

Each of the pixel thin film transistors TFT includes a gate electrode, a source electrode and a drain electrode. A gate electrode of each of the pixel thin film transistors TFT is electrically connected to one of the gate lines GL1, GL2, . . . GLN. The source electrode of each of the pixel thin film transistors TFT is electrically connected to one of the data lines DL1, DL2, . . . DLM. The drain electrode of each of the pixel thin film transistors TFT is electrically connected to a first electrode of the liquid crystal capacitor Clc. A second electrode of the liquid crystal capacitor Clc is electrically connected to a common electrode (not shown) of the second substrate 320.

The gate driving circuit 100 includes the shift register shown in FIG. 5, and is in the first peripheral region PA1. The gate driving circuit 100 is electrically connected to the gate lines GL1, GL2, . . . GLN to apply the first, second, . . . N-th gate signals G1, G2, . . . GN to the gate lines GL1, GL2, . . . GLN, in sequence. In FIGS. 5 and 7, the gate driving circuit 100 is formed on the first substrate 310, and is formed from substantially the same layers as the pixel thin film transistors TFT. Alternatively, the gate driving circuit 100 may be a chip that is directly formed on the first substrate.

The data driving circuit 370 is on the second peripheral region PA2. The data driving circuit 370 is electrically connected to the data lines DL1, DL2, . . . DLM to apply the data signals to the data lines DL1, DL2, . . . DLM. For example, the data driving circuit 370 may be a chip formed on the first substrate 310. Alternatively, the data driving circuit 370 may be formed from substantially the same layers as the pixel thin film transistors TFT.

The flexible circuit board 400 is attached to a portion of the second peripheral region PA2, so that an externally provided unit (not shown) is electrically connected to the data driving circuit 370 through the flexible circuit board 400. For example, the externally provided unit (not shown) may be a graphic controller.

According to the display device shown in FIGS. 5 and 7, each of the stages SRC1, SRC2, . . . SRCN includes the auxiliary transistor Q4a, so that the discharging part 40 functions normally, even though the fourth transistor Q4 malfunctions. Therefore, the chance of malfunction of the gate driving circuit 100 is decreased, thereby improving image display quality of the display device. In addition, an electric power applied to the discharging part 40 is divided between the fourth transistor Q4 and the auxiliary transistor Q4a to increase a lifetime of the fourth transistor Q4 and to stabilize an operation of the discharging part 40.

Figure 8:
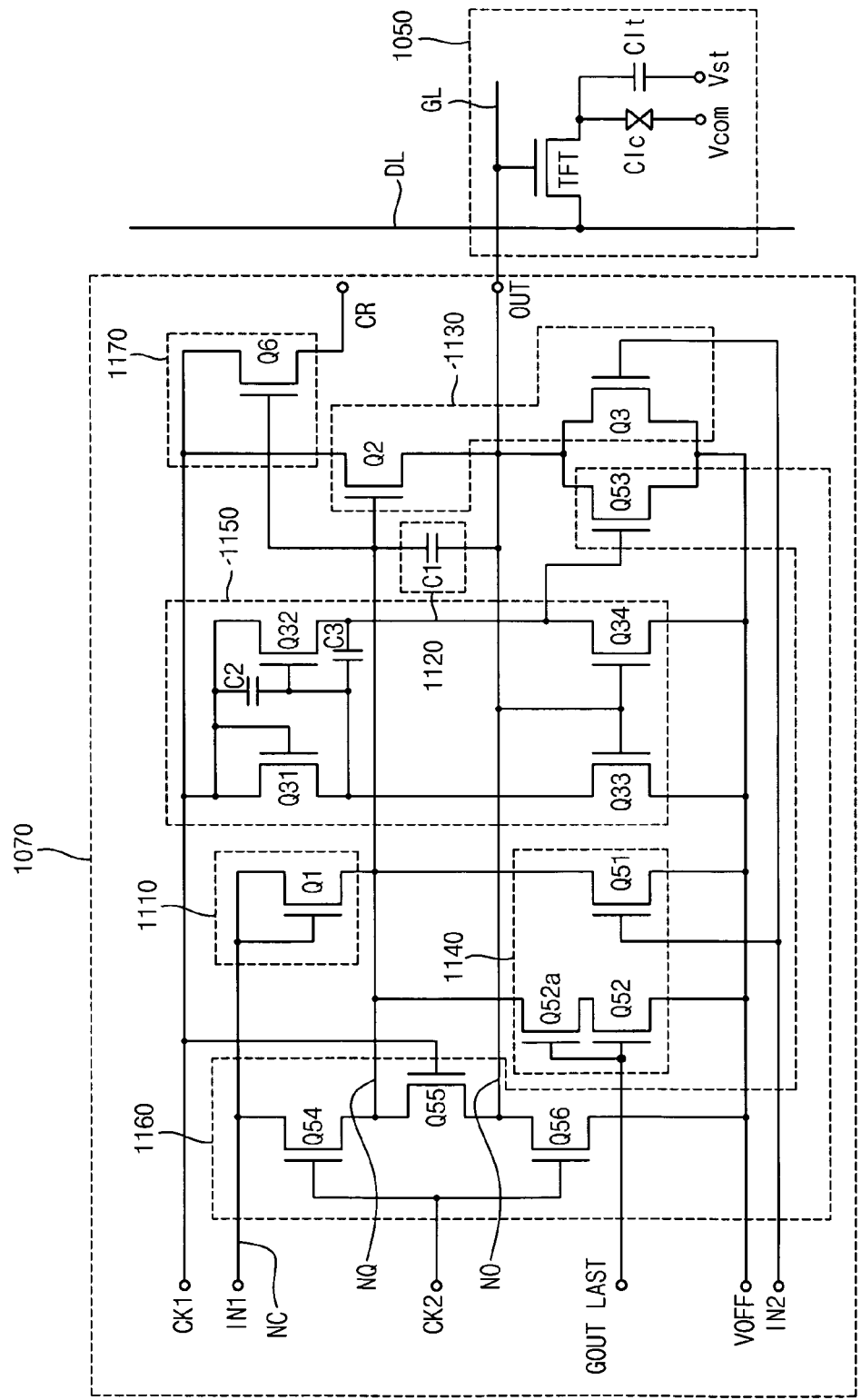
FIG. 8 is a circuit diagram illustrating a stage in accordance with an embodiment of the present invention.

FIG. 8 is a circuit diagram illustrating a stage in accordance with an exemplary embodiment of the present invention. In FIG. 8, first and second electrodes of a transistor are the source and drain electrodes, respectively. Alternatively, the first and second electrodes of the transistor may be the drain and source electrodes, respectively.

Referring to FIG. 8, the stage 1070 is electrically connected to a pixel 1050 through a gate line GL.

The pixel 1050 includes a pixel thin film transistor TFT, a liquid crystal capacitor Clc and a storage capacitor Cst.

A gate electrode of the pixel thin film transistor TFT is electrically connected to a gate line GL. A first electrode of the pixel thin film transistor TFT is electrically connected to the liquid crystal capacitor Clc and the storage capacitor Cst. A second electrode of the pixel thin film transistor TFT is electrically connected to a data line DL.

The stage 1070 includes a buffering part 1110, a charging part 1120, a driving part 1130, a discharging part 1140, a first holding part 1150, a second holding part 1160 and a carry part 1170. The stage 1070 outputs a gate signal (or a scan signal) to the gate line GL based on a scan start signal or a carry signal of a previous stage.

The buffering part 1110 includes a buffer transistor Q1. A gate electrode of the buffer transistor Q1 is electrically connected to a first electrode of the buffer transistor Q1 and a first input terminal IN1. When the stage is a first stage of a shift register, the scan start signal is applied to the first input terminal IN1. When the stage is not the first stage of the shift register, a carry signal of the previous stage is applied to the first input terminal IN1. A second electrode of the buffer transistor Q1 is electrically connected to the charging part 1120, the driving part 1130, the discharging part 1150 and the holding part 1160. In FIG. 8, the buffer transistor Q1 may include a channel layer (not shown) including hydrogenated amorphous silicon.

The charging part 1120 includes a charging capacitor C1. The scan start signal or the carry signal of the previous stage is stored in the charging capacitor C1. A first storage electrode of the charging capacitor C1 is electrically connected to the second electrode of the buffer transistor Q1 and the charging part 140. A second storage electrode of the charging capacitor C1 is electrically connected to an output terminal OUT of the present stage.

The driving part 1130 includes a first driving transistor Q2 and a second driving transistor Q3.

A first electrode of the first driving transistor Q2 is electrically connected to a first clock terminal CK1. A first clock signal is applied to the first clock terminal CK1 of odd-numbered stage, and a second clock signal is applied to the first clock terminal CK1 of even-numbered stage. A gate electrode of the first driving transistor Q2 is electrically connected to the first storage electrode of the charging capacitor C1, the second electrode of the buffer transistor Q1, the discharging part 1140 and the second holding part 1160. A second electrode of the first driving transistor Q2 is electrically connected to the second electrode of the charging capacitor C1 and an output terminal OUT of the present stage. In FIG. 8, the first driving transistor Q2 may include a channel layer (not shown) including hydrogenated amorphous silicon.

A gate electrode of the second driving transistor Q3 is electrically connected to a second input terminal IN2. The output signal of the next stage is applied to the second input terminal IN2. A first electrode of the second driving transistor Q3 is electrically connected to the second electrode of the charging capacitor C1, the second electrode of the first driving transistor Q2 and the output terminal OUT. A second electrode of the second driving transistor Q3 is electrically connected to the off-voltage terminal VOFF. In FIG. 8, the second driving transistor Q3 may include a channel layer (not shown) including hydrogenated amorphous silicon.

The discharging part 1140 includes a first discharge transistor Q51, a second discharge transistor Q52 and an auxiliary transistor Q52a. The discharging part 1140 initially discharges an electric charge stored in the charging capacitor C1 to the off-voltage terminal VOFF based on an output signal of a next stage. The output signal of the next stage is applied to the discharging part 1140 through the second input terminal IN2. Also, the discharging part 1140 may secondly discharge the electric charge stored in the charging capacitor C1 to the off-voltage terminal VOFF based on an output signal of a last stage. The output signal of the last stage is applied to the discharging part 1140 through the last scan signal terminal GOUT_LAST.

A gate electrode of the first discharge transistor Q51 is electrically connected to the second input terminal IN2. A first electrode of the first discharge transistor Q51 is electrically connected to the first storage electrode of the charging capacitor C1. A second electrode of the first discharge transistor Q51 is electrically connected to the off-voltage terminal VOFF. In FIG. 8, the first discharge transistor Q51 may include a channel layer (not shown) including hydrogenated amorphous silicon.

A gate electrode of the second discharge transistor Q52 is electrically connected to the last scan signal terminal GOUT_LAST. A first electrode of the second discharge transistor Q52 is electrically connected to the auxiliary transistor Q52a. A second electrode of the second discharge transistor Q52 is electrically connected to the off-voltage terminal VOFF. In FIG. 8, the second discharge transistor Q52 may include a channel layer (not shown) including hydrogenated amorphous silicon.

A gate electrode of the auxiliary transistor Q52a is electrically connected to the last scan signal terminal GOUT_LAST. A first electrode of the auxiliary transistor Q52a is electrically connected to the charging capacitor C1 through the buffering part 1110. A second electrode of the auxiliary transistor Q52a is electrically connected to the first electrode of the second discharge transistor Q52. That is, the auxiliary transistor Q52a and the second discharge transistor Q52 are electrically connected, in serial. In FIG. 8, the auxiliary transistor Q52a may include a channel layer (not shown) including hydrogenated amorphous silicon.

The first holding part 1150 includes a first holding transistor Q31, a second holding transistor Q32, a third holding transistor Q33, a fourth holding transistor Q34, a first holding capacitor C2 and a second holding capacitor C3.

A first electrode of the first holding transistor Q31 is electrically connected to a gate electrode of the first holding transistor Q31 and the first clock terminal CK1. A second electrode of the first holding transistor Q31 is electrically connected to a gate electrode of the second holding transistor Q32. The gate electrode of the second holding transistor Q32 is electrically connected to a first electrode of the second holding transistor Q32 through the first holding capacitor C2, and electrically connected to a second electrode of the second holding transistor Q32 through the second holding capacitor C3. The first electrode of the second holding transistor Q32 is electrically connected to the first electrode of the first holding transistor Q31 and the first clock terminal CK1. The second electrode of the second holding transistor Q32 is electrically connected to the second holding part 1160. In FIG. 8, each of the first and second holding transistors Q31 and Q32 may include a channel layer (not shown) including hydrogenated amorphous silicon.

A gate electrode of the third holding transistor Q33 is electrically connected to the output terminal OUT of the present stage, the second holding part 1160 and a gate electrode of the fourth holding transistor Q34. A first electrode of the third holding transistor Q33 is electrically connected to the second electrode of the first holding transistor Q31 and the gate electrode of the second holding transistor Q32. A second electrode of the third holding transistor Q33 is electrically connected to the off-voltage terminal VOFF. In FIG. 8, each of the second and third holding transistors Q32 and Q33 may include a channel layer (not shown) including hydrogenated amorphous silicon.

A gate electrode of the fourth holding transistor Q34 is electrically connected to the output terminal OUT, the second holding part 1160 and the gate electrode of the third holding transistor Q33. A first electrode of the fourth holding transistor Q34 is electrically connected to the second electrode of the second holding transistor Q32 and the second holding part 1160. A second electrode of the fourth holding transistor Q34 is electrically connected to the off-voltage terminal VOFF. In FIG. 8, the fourth holding transistor Q34 may include a channel layer (not shown) including hydrogenated amorphous silicon.

The second holding part 1160 includes a fifth holding transistor Q53, a sixth holding transistor Q54, a seventh holding transistor Q55 and an eighth holding transistor Q56 to prevent a floating of the output terminal OUT.

A gate electrode of the fifth holding transistor Q53 is electrically connected to the second electrode of the second holding transistor Q32 and the first electrode of the fourth holding transistor Q34. A first electrode of the fifth holding transistor Q53 is electrically connected to the second electrode of the first driving transistor Q2, the first electrode of the second driving transistor Q3, the second electrode of the charging capacitor C1, a second electrode of the seventh holding transistor Q55 and a first electrode of the eighth holding transistor Q56. A second electrode of the fifth transistor Q53 is electrically connected to the off-voltage terminal VOFF.

A gate electrode of the sixth holding transistor Q54 is electrically connected to a second clock terminal CK2 and a gate electrode of the eighth holding transistor Q56. The second clock signal is applied to the second clock terminal CK2 of the odd-numbered stage. The first clock signal is applied to the second clock terminal CK2 of the even-numbered stage. For example, the signal applied to the second clock terminal CK2 has an opposite phase to the signal applied to the first clock terminal CK1. A first electrode of the sixth holding transistor Q54 is electrically connected to the first input terminal IN1, the first electrode of the buffer transistor Q1 and the first electrode of the auxiliary transistor Q52a. A second electrode of the sixth holding transistor Q54 is electrically connected to a first electrode of the seventh holding transistor Q55, the second electrode of the buffer transistor Q1, the first electrode of the first discharge transistor Q51, the first electrode of the charging capacitor C1, the gate electrode of the first driving transistor Q2 and the carry part 1170.

A gate electrode of the seventh holding transistor Q55 is electrically connected to the first clock terminal CK1. The first electrode of the seventh holding transistor Q55 is electrically connected to the second electrode of the sixth holding transistor Q54, the second electrode of the buffer transistor Q1, the first electrode of the first discharge transistor Q51, the first electrode of the charging capacitor C1, the gate electrode of the first driving transistor Q2 and the carry part 1170. The second electrode of the seventh holding transistor Q55 is electrically connected to a first electrode of the eighth holding transistor Q56 and the output terminal OUT of the present stage.

The gate electrode of the eighth holding transistor Q56 is electrically connected to the second clock terminal CK2 and the gate electrode of the sixth holding transistor Q54. A second electrode of the eighth holding transistor Q56 is electrically connected to the off-voltage terminal VOFF.

When the output signal that is applied to the output terminal OUT of the present stage is a high level, the second and fourth holding transistors Q32 and Q34 pull-down the gate electrode of the fifth holding transistor Q53 to an off-voltage that is applied to the off-voltage terminal VOFF.

When the output signal that is applied to the output terminal OUT of the present stage is a low level, the signal applied to the first clock terminal CK1 is applied to the gate electrode of the fifth holding transistor Q53 through the second holding transistor Q32. In FIG. 8, when the output signal is not a high level, a level of a voltage applied to the gate electrode of the second holding transistor Q32 equals to a value got by subtracting a threshold voltage of the first holding transistor Q31 from a high level of the signal applied to the first clock terminal CK1. That is, when the output signal is not a high level, a signal synchronized with the signal that is applied to the first clock terminal CK1 is applied to the gate electrode of the fifth holding transistor Q53.

When the signal applied to the second clock terminal CK2 is a high level, the off-voltage applied to the off-voltage terminal VOFF is applied to the output terminal OUT through the eighth holding transistor Q56.

The carry part 1170 includes a carry transistor Q6. The carry part 1170 outputs the carry signal of the present stage based on the electric charge stored in the charging capacitor C1 and the signal applied to the first clock terminal CK1.

A gate electrode of the carry transistor Q6 is electrically connected to the second electrode of the buffer transistor Q1. A first electrode of the carry transistor Q6 is electrically connected to the first clock terminal CK1. A second electrode of the carry transistor Q6 outputs the carry signal. The second electrode of the carry transistor Q6 is electrically insulated from the output terminal OUT, so that the carry signal has a uniform luminance although the output signal is distorted.

Figure 9:
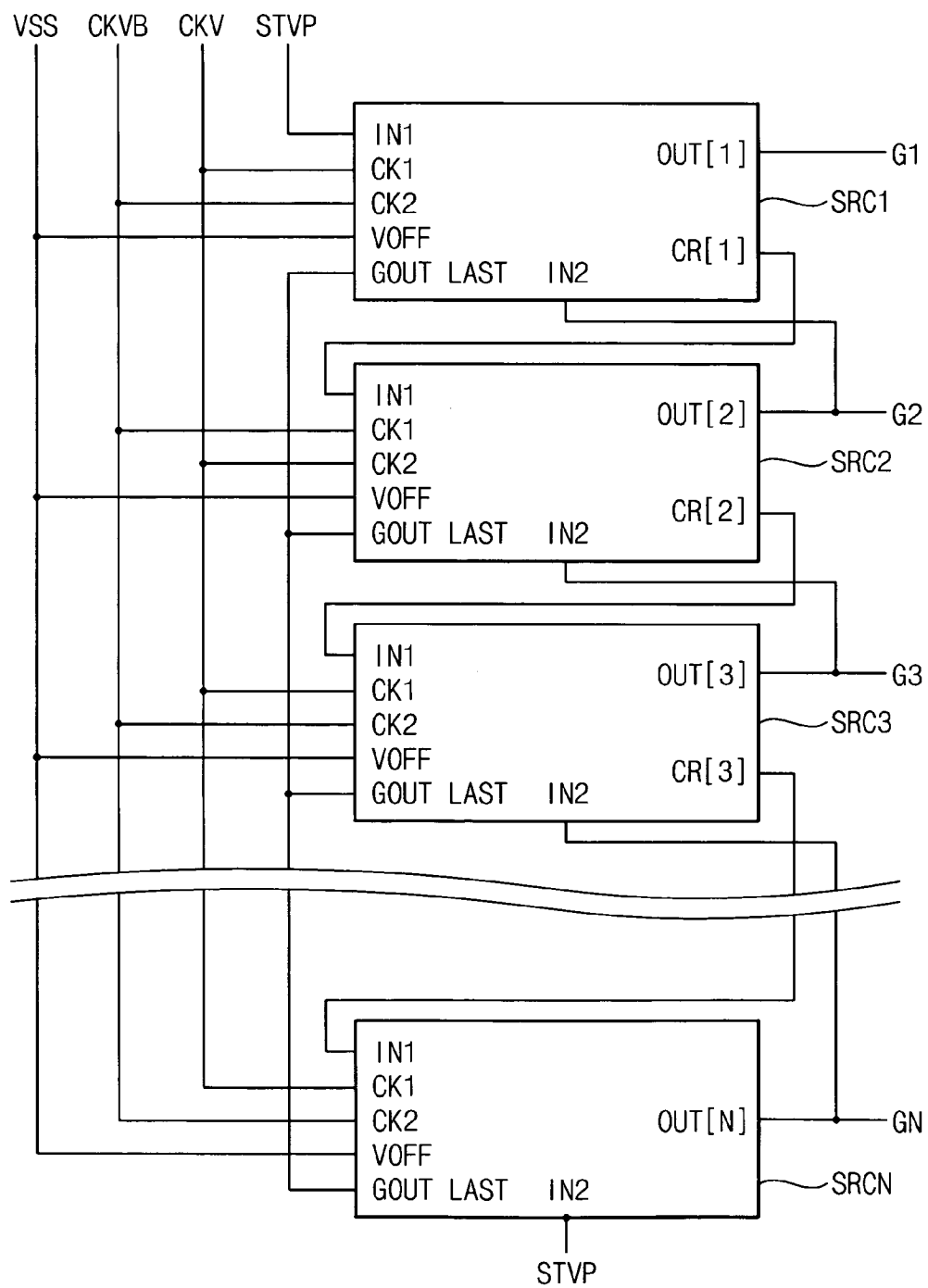
FIG. 9 is a plan view illustrating a shift register having the stage shown in FIG. 8.

FIG. 9 is a plan view illustrating a shift register having the stage shown in FIG. 8.

Referring to FIG. 9, the shift register includes first, second, ... N-th stages SRC1, SRC2, ... SRCN.

The scan start signal STVP is applied to a first input terminal IN1 of a first stage SRC1. The carry signal that is outputted from a carry signal CRp−1 of the previous stage SRCp−1 is applied to the first input terminal IN1 of the present stage SRCp, wherein 'p' is a natural number that is greater than one and not greater than 'N'. An output signal Gp that is outputted from the output terminal OUT of the present stage SRCp is applied to a second input terminal IN2 of the previous stage SRCp−1. The first clock signal CKV is applied to first clock terminals CK1 of the odd-numbered stages SRC1, SRC3, ... SRCN−1 and second clock terminals CK2 of the even-numbered stages SRC2, SRC4, ... SRCN. The second clock signal CKVB is applied to first clock terminals CK1 of the even-numbered stages SRC2, SRC4, ... SRCN and second clock terminals CK2 of the odd-numbered stages SRC1, SRC3, ... SRCN−1. The off-voltage VSS is applied to off-voltage terminal VOFF of each of the stages SRC1, SRC2, ... SRCN. The output signal of the last stage SRCN is applied to the last scan signal terminal GOUT_LAST. In FIG. 9, the output signal GOUT_LAST of the last stage SRCN is the output signal GN applied to N-th stage SRCN.

In operation, the stages SRC1, SRC2, ... SRCN of the shift register apply the output signals G1, G2, ... GN of the first, second, ... N-th stages SRC1, SRC2, ... SRCN to the first, second, ... N-th gate lines, in sequence, based on the scan start signal STVP, the first clock signal CKV, the second clock signal CKVB, the off-voltage VSS, the first, second, ... (N−1)-th carry signals CR1, CR2, ... CRN−1 and the output signal GOUT_LAST of the last stage SRCN.

Figure 10:
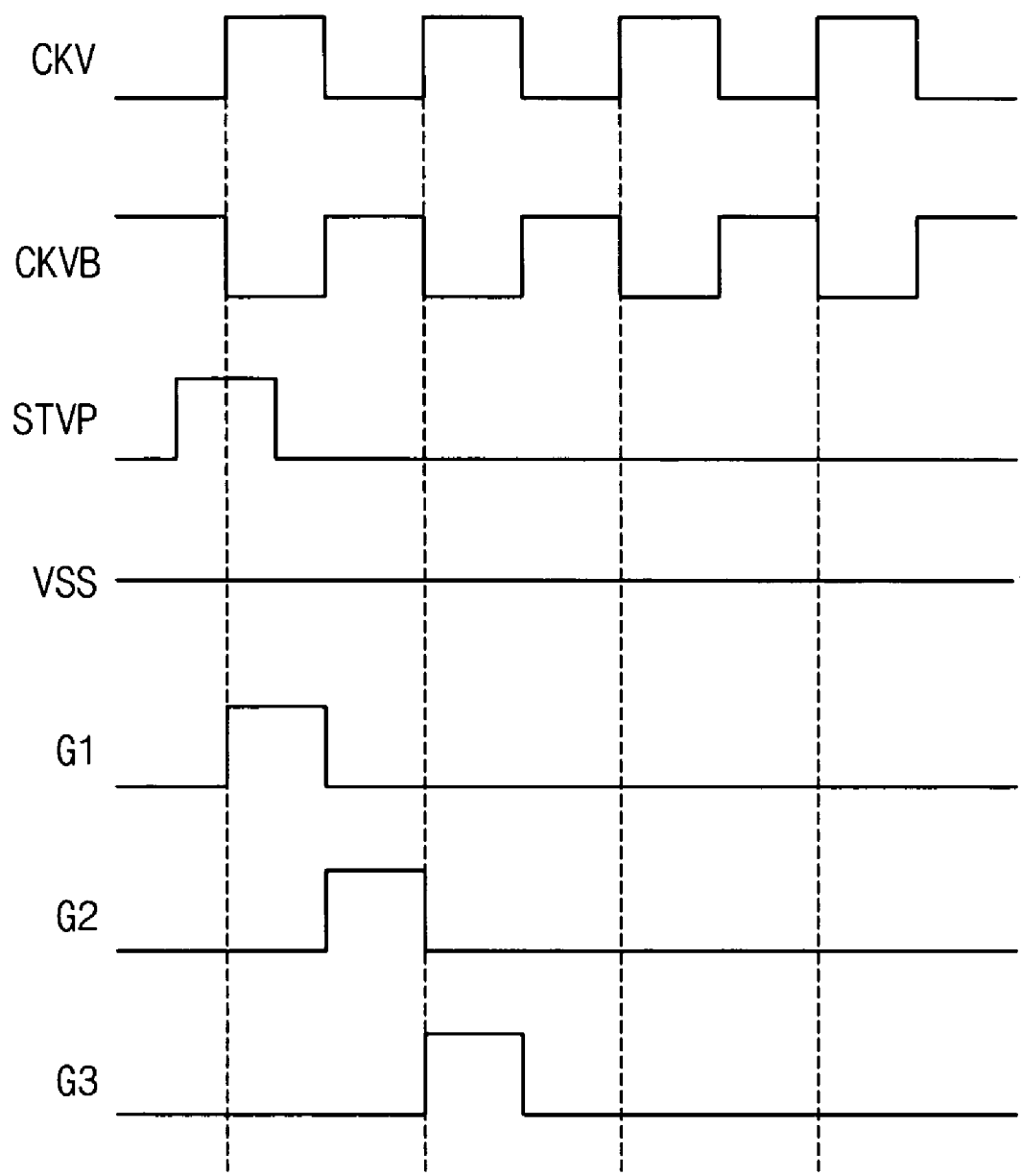
FIG. 10 is a timing diagram illustrating signals of the shift register shown in FIG. 9.

FIG. 10 is a timing diagram illustrating signals of the shift register shown in FIG. 9.

Referring to FIGS. 9 and 10, the first clock signal CKV has a substantially opposite phase to the second clock signal CKVB. The scan start signal STV has a high level in an initial stage of each of frames. The first, second, third ... N-th gate signals G1, G2, G3, ... GN are applied to the first, second, ... N-th gate lines, in sequence.

Figure 11:
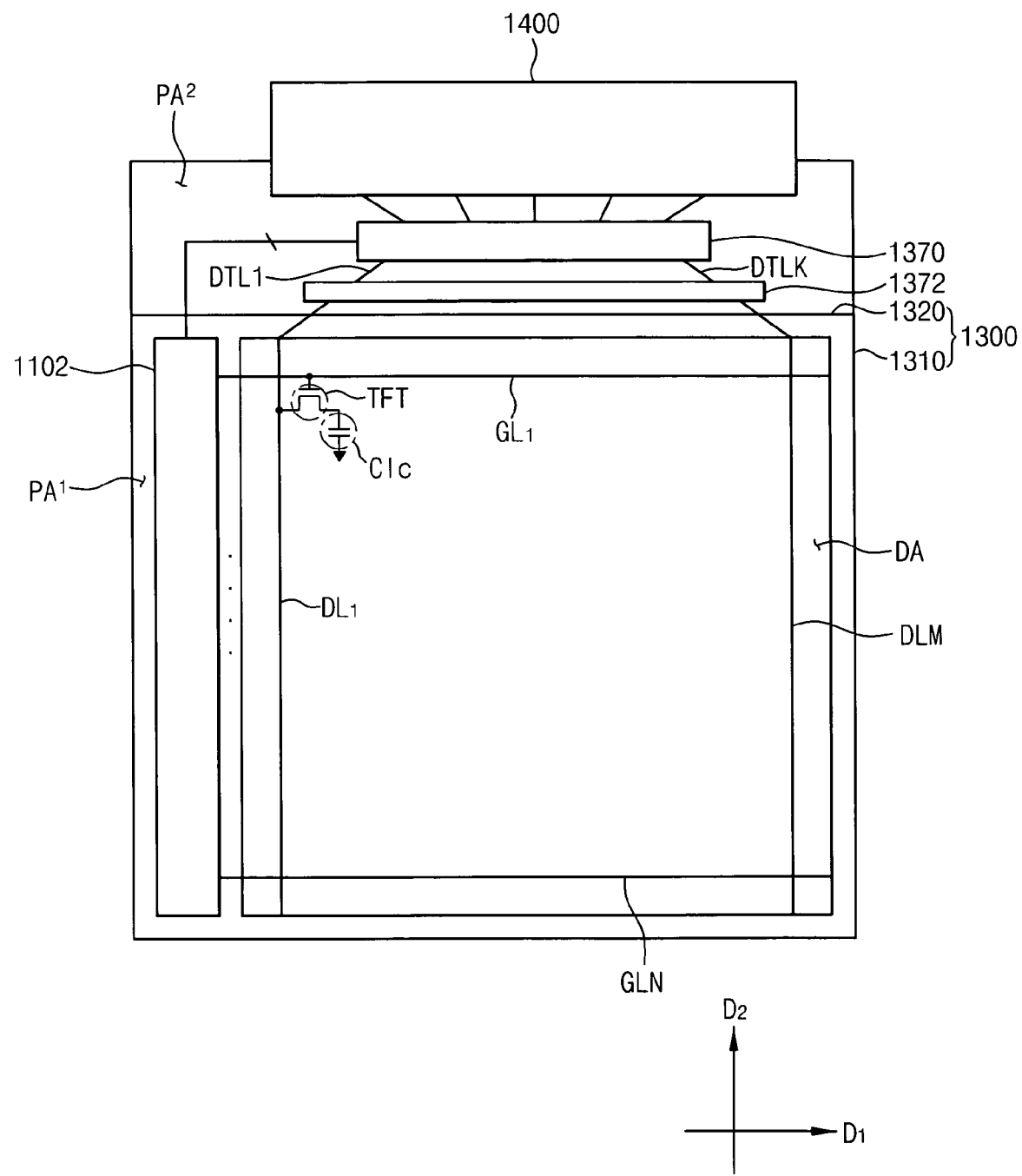
FIG. 11 is a plan view illustrating a display device having the shift register shown in FIG. 9.

FIG. 11 is a plan view illustrating a display device having the shift register shown in FIG. 9.

Referring to FIGS. 9 and 11, the display device 1500 includes a gate driving circuit 1102, a display panel 1300, a data driving circuit 1370, a signal selecting circuit 1372 and a flexible circuit board 1400.

The display panel 1300 includes a first substrate 1310, a second substrate 1320 and a liquid crystal layer (not shown). The second substrate 1320 corresponds to and faces the first substrate 1310. The liquid crystal layer (not shown) is interposed between the first and second substrates 1310 and 1320.

The first substrate 1310 includes a display region DA, a first peripheral region PA1 and a second peripheral region PA2. An image is displayed in the display region DA. The first and second peripheral regions PA1 and PA2 are adjacent to the display region DA.

The first substrate 1310 includes a plurality of gate lines GL1, GL2, ... GLN, a plurality of data lines DL1, DL2, ... DLM, a plurality of pixel thin film transistors TFT and a plurality of liquid crystal capacitors Clc in the display region DA.

The gate lines GL1, GL2, ... GLN are extended in a first direction D1. The gate lines are electrically connected to the output terminals of the stages of the gate driving circuit 1102 in the first peripheral region PA1. The data lines DL1, DL2, ... DLM cross the gate lines GL1, GL2, ... GLN, and are extended in a second direction D2 that is substantially perpendicular to the first direction D1. The data lines DL1, DL2, ... DLM are electrically insulated from the gate lines GL1, GL2, ... GLN. The data lines DL1, DL2, ... DLM are electrically connected to the signal selecting circuit 1372 in the second peripheral region PA2. The gate and data lines GL1, GL2, ... GLN and DL1, DL2, ... DLM define a plurality of pixel regions. The pixel regions are arranged in a matrix shape.

A gate electrode of each of the pixel thin film transistors TFT is electrically connected to one of the gate lines GL1, GL2, ... GLN. A second electrode of each of the pixel thin film transistors TFT is electrically connected to one of the data lines DL1, DL2, ... DLM. A first electrode of each of the pixel thin film transistors TFT is electrically connected to a first electrode of the liquid crystal capacitor Clc, so that a data signal is applied to the second electrode of the liquid crystal capacitor Clc through the pixel thin film transistor TFT.

The gate driving circuit 1102 includes the shift register shown in FIG. 9, and is disposed in the first peripheral region PA1. The gate driving circuit 1102 is electrically connected to the gate lines GL1, GL2, ... GLN to apply the first, second, ... N-th gate signals G1, G2, ... GN to the gate lines GL1, GL2, ... GLN, in sequence. In FIG. 11, the gate driving circuit 1102 is formed on the first substrate 1310, and is formed from substantially the same layers as the pixel thin film transistors TFT. Alternatively, the gate driving circuit 1102 may be a chip that is directly formed on the first substrate 1310.

The data driving circuit 1370 is disposed in the second peripheral region PA2. The data driving circuit 1370 is electrically connected to data signal transmitting lines DTL1, DTL2, ... DTLK to apply primary data signals to the signal selecting circuit 1372. For example, the data driving circuit 1370 may be a chip formed on the first substrate 1310. Alternatively, the data driving circuit 1370 may be formed from substantially the same layers as the pixel thin film transistors TFT.

The signal selecting circuit 1372 is formed on the second peripheral region PA2 between the data driving circuit 1372 and the display region DA. The signal selecting circuit 1372 is electrically connected to the data lines DL1, DL2, ... DLM. The signal selecting circuit 1372 divides the primary data signals into the data signals, and applies the data signals to the data lines DL1, DL2, ... DLM. In FIG. 11, the signal selecting circuit 1372 includes a plurality of signal selecting transistors (not shown). The number of data lines DL1, DL2, ... DLM may be about twice the number of data signal transmitting lines DTL1, DTL2, ... DTLK. In FIG. 11, the signal selecting circuit 1372 is formed on the first substrate 1310, and is formed from substantially the same layers as the pixel thin film transistors TFT. The signal selecting circuit 1372 may simplify a structure of the data driving circuit 1370 to increase a design margin of the data driving circuit 1370.

The flexible circuit board 1400 is attached to a portion of the second peripheral region PA2, so that an externally provided unit (not shown) is electrically connected to the data driving circuit 1370 through the flexible circuit board 400.

According to the display device shown in FIGS. 8 to 11, each of the stages SRC1, SRC2, ... SRCN includes the auxiliary transistor Q52a, so that the discharging part 1140 functions normally, even though the second discharge transistor Q52 malfunctions. Therefore, the chance of malfunction of the gate driving circuit 1102 is decreased, thereby improving image display quality of the display device. In addition, an electric power applied to the discharging part 1140 is divided into the second discharge transistor Q52 and the auxiliary transistor Q52a to increase a lifetime of the second discharge transistor Q52 and to stabilize an operation of the discharging part 1140.

Figure 12:
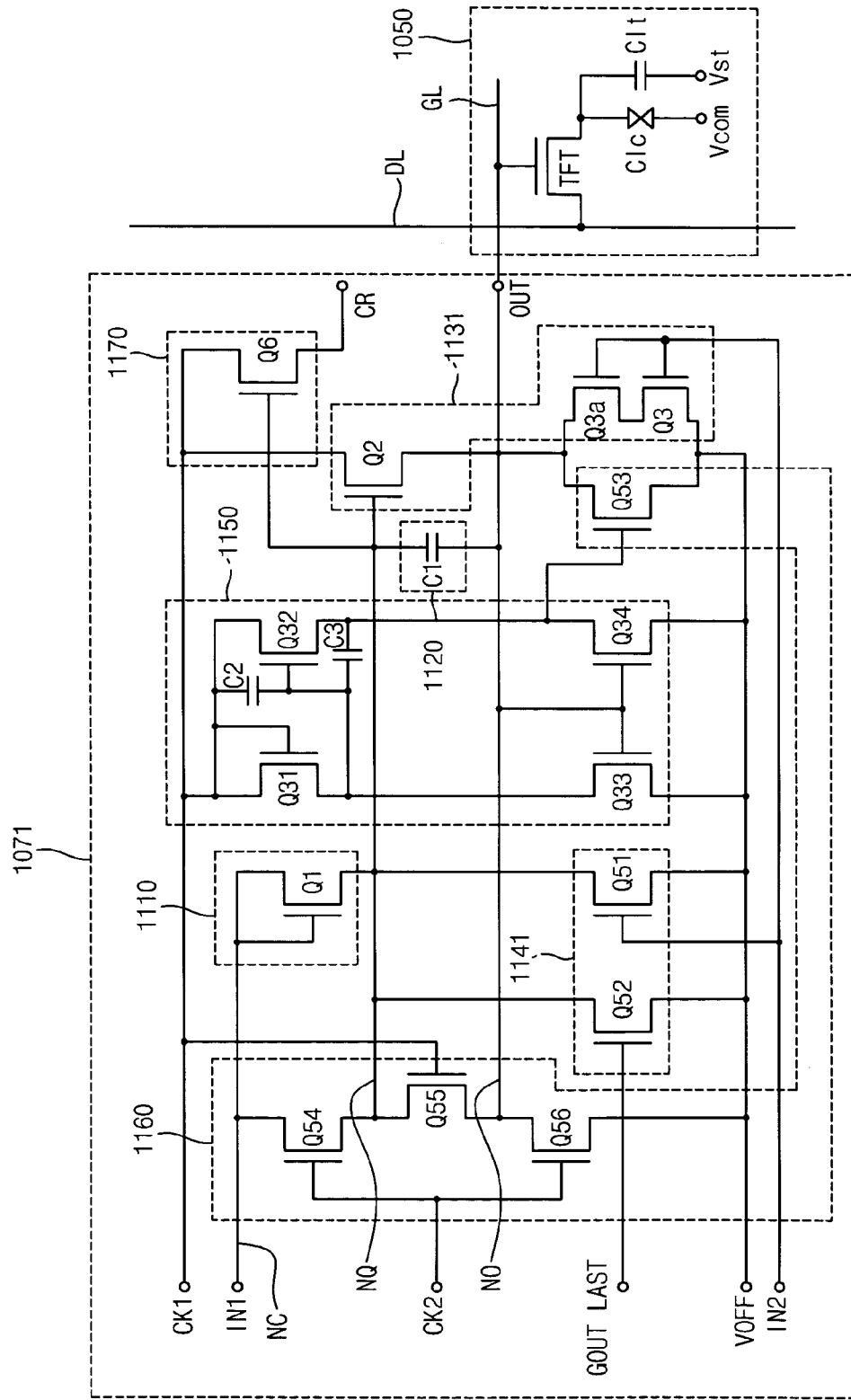
FIG. 12 is a circuit diagram illustrating a stage in accordance with an embodiment of the present invention.

FIG. 12 is a circuit diagram illustrating a stage in accordance with an exemplary embodiment of the present invention. The stage of FIG. 12 is the same as in FIG. 8 except for a driving part and a discharging part. Thus, the same reference numerals will be used to refer to the same or like parts as those described in FIG. 8 and any further explanation concerning the above elements will be omitted. In FIG. 12, first and second electrodes of a transistor are source and drain electrodes, respectively. Alternatively, the first and second electrodes of the transistor may be the drain and source electrodes, respectively.

Referring to FIG. 12, the stage 1071 is electrically connected to a pixel 1050 through a gate line GL.

The stage 1071 includes a buffering part 1110, a charging part 1120, a driving part 1131, a discharging part 1141, a first holding part 1150, a second holding part 1160 and a carry part 1170. The stage 1071 outputs a gate signal (or a scan signal) to the gate line GL based on a scan start signal or a carry signal of a previous stage.

The driving part 1131 includes a first driving transistor Q2, a second driving transistor Q3 and an auxiliary transistor Q3a.

A first electrode of the first driving transistor Q2 is electrically connected to a first clock terminal CK1. A first clock signal is applied to, the first clock terminal CK1 of odd-numbered stage, and a second clock signal is applied to the first clock terminal CK1 of the even-numbered stage. A gate electrode of the first driving transistor Q2 is electrically connected to the first storage electrode of the charging capacitor C1, the second electrode of the buffer transistor Q1, the discharging part 1140 and the second holding part 1160. A second electrode of the first driving transistor Q2 is electrically connected to the second electrode of the charging capacitor C1 and an output terminal OUT of the present stage.

A gate electrode of the second driving transistor Q3 is electrically connected to a second input terminal IN2. A first electrode of the second driving transistor Q3 is electrically connected to a second electrode of the auxiliary transistor Q3a. A second electrode of the second driving transistor Q3 is electrically connected to an off-voltage terminal VOFF.

A gate electrode of the auxiliary transistor Q3a is electrically connected to the second input terminal IN2. A first electrode of the auxiliary transistor Q3a is electrically connected to a second storage electrode of the charging capacitor C1, a second electrode of the first driving transistor Q2 and the output terminal OUT. A second electrode of the auxiliary transistor Q3a is electrically connected to the first electrode of the second driving transistor Q3. That is, the auxiliary transistor Q3a is electrically connected in series to the second driving transistor Q3.

The discharging part 1141 includes a first discharge transistor Q51 and a second discharge transistor Q52. The discharging part 1141 initially discharges the electric charge stored in the charging capacitor C1 to the off-voltage terminal VOFF based on an output signal of a next stage. The output signal of the next stage is applied to the discharging part 1141 through the second input terminal IN2. Also, the discharging part 1141 may secondly discharge the electric charge stored in the charging capacitor C1 to the off-voltage terminal VOFF based on an output signal of a last stage. The output signal of the last stage is applied to the discharging part 1141 through the last scan signal terminal GOUT_LAST.

A gate electrode of the first discharge transistor Q51 is electrically connected to the second input terminal IN2. A first electrode of the first discharge transistor Q51 is electrically connected to the first electrode of the charging capacitor C1. A second electrode of the first discharge transistor Q51 is electrically connected to the off-voltage terminal VOFF.

A gate electrode of the second discharge transistor Q52 is electrically connected to the last scan signal terminal GOUT_LAST. A first electrode of the second discharge transistor Q52 is electrically connected to the charging capacitor C1 through the buffering part 1110. A second electrode of the second discharge transistor Q52 is electrically connected to the off-voltage terminal VOFF.

According to the stage shown in FIG. 12, the stage includes the auxiliary transistor Q32a, so that the driving part 1141 functions normally, even though the second driving transistor Q32 malfunctions. In addition, an electric power applied to the discharging part 1141 is divided between the second driving transistor Q32 and the auxiliary transistor Q32a to increase a lifetime of the second driving transistor Q32 and to stabilize an operation of the driving part 1140.

In FIGS. 1 to 12, the auxiliary transistor is electrically connected in series to the discharge transistor or the driving transistor. Alternatively, the auxiliary transistor may be electrically connected to various transistors. Each of the stages may include a plurality of auxiliary transistors.

According to exemplary embodiments of the present invention, each of the stages includes the auxiliary transistor, so that the stage normally functions, although the switching transistor electrically connected to the auxiliary transistor malfunctions. Therefore, the chance of malfunction of the gate driving circuit is decreased, thereby improving image display quality of the display device. In addition, the electric power applied to the switching transistor is divided between the switching transistor and the auxiliary transistor to increase a lifetime of the switching transistor and to stabilize an operation of the stage.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A shift register including a plurality of stages to output a plurality of output signals, in sequence, each of the plurality of stages comprising:
    a driving part outputting an output signal of a selected stage based on one of a start signal and an output signal of a previous stage, and a clock signal, the driving part including;
        a first transistor connected to a first input terminal that receives one of the output signals of the previous stage and the start signal;
        a second transistor connected to a clock signal line and an output terminal that outputs the output signal of the selected stage; and
        a third transistor connected to the output terminal, an off-voltage terminal and a second input terminal that receives an output signal of a next stage to the selected stage; and
    a discharging part that discharges the output signal of the selected stage, the discharging part including:
        a discharge transistor having a gate electrode that receives an output signal of a next stage to the selected stage; and
        an auxiliary transistor having a gate electrode that receives the output signal of the next stage, the auxiliary transistor being electrically connected in series to the discharge transistor,
    wherein the third transistor receives the output signal of the next stage simultaneously with a receipt of the output signal of the next stage by the discharge transistor.

2. The shift register of claim 1, wherein each of the discharge transistor and the auxiliary transistor comprises a thin film transistor, and a channel layer of the thin film transistor is formed of amorphous silicon.

3. The shift register of claim 1, wherein the gate electrode of the discharge transistor is electrically connected to the gate electrode of the auxiliary transistor.

4. The shift register of claim 3, wherein a drain electrode of the discharge transistor is electrically connected to a source electrode of the auxiliary transistor.

5. The shift register of claim 3, wherein a source electrode of the discharge transistor is electrically connected to a drain electrode of the auxiliary transistor.

6. The shift register of claim 1, wherein the discharge transistor further comprises a channel layer formed on the gate electrode, a first electrode formed on the channel layer and a second electrode spaced apart from the first electrode formed on the channel layer, wherein the channel layer exposed between the first and second electrodes has a substantially I-shape.

7. The shift register of claim 1, wherein the discharge transistor and the auxiliary transistor are adjacent to a corner of each of the plurality of stages.

8. A shift register including a plurality of stages to output a plurality of output signals, in sequence, each of the plurality of stages comprising:

a driving part that outputs an output signal of a selected stage based on one of a start signal and an output signal of a previous stage, and one of a first clock signal and a second clock signal having a substantially opposite phase to the first clock signal; and a discharging part that discharges the output signal of the selected stage, the discharging part including:

a discharge transistor having a gate electrode that receives an output signal of a next stage to the selected stage; and an auxiliary transistor having a gate electrode that receives the output signal of the next stage, wherein the auxiliary transistor is electrically connected in series to the discharge transistor, wherein the driving part outputs the output signal of the selected stage based upon one of the start signal and a carry signal of the previous stage and one of the first and second clock signals, and each of the stages further comprises a carry part that outputs a carry signal of the selected stage based upon one of the start signal and the carry signal of the previous stage, and wherein the carry signal is electrically independent from the output signal.

9. The shift register of claim 8, wherein each of the discharge transistor and the auxiliary transistor comprises a thin film transistor, and a channel layer of the thin film transistor is formed of amorphous silicon.

10. A shift register including a plurality of stages to output a plurality of output signals, in sequence, each of the plurality of stages comprising:

a driving part including a switching transistor and an auxiliary transistor electrically connected in series to the switching transistor to output an output signal of a selected stage based on one of a start signal and an output signal of a previous stage, and one of a first clock signal and a second clock signal having a substantially opposite phase to the first clock signal, wherein a first electrode of the auxiliary transistor is connected to an output terminal through which the output signal is outputted and a second electrode of the auxiliary transistor is connected to a first electrode of the switching transistor and a second electrode of the switching transistor is connected to an off-voltage terminal; and a discharging part that discharges the output signal of the selected stage based on an output signal of a next stage to the selected stage, wherein a gate electrode of the switching transistor is electrically connected in common with a gate electrode of the auxiliary transistor and the gate electrodes are connected to an output signal of the next stage.

11. The shift register of claim 10, wherein each of the switching transistor and the auxiliary transistor comprises a thin film transistor, and a channel layer of the thin film transistor is formed of amorphous silicon.

12. The shift register of claim 10, wherein a drain electrode of the switching transistor is electrically connected to a source electrode of the auxiliary transistor.

13. The shift register of claim 10, wherein a source electrode of the switching transistor is electrically connected to a drain electrode of the auxiliary transistor.

14. The shift register of claim 10, wherein the driving part outputs the output signal of the selected stage based on one of the start signal and a carry signal of the previous stage and one of the first and second clock signals, and each of the plurality of stages further comprises a carry part outputting a carry signal of the selected stage based on one of the start signal and the carry signal of the previous stage, and the carry signal is electrically independent from the output signal.

15. A display device comprising:

a display panel including a plurality of gate lines, a plurality of data lines and a plurality of pixels electrically connected to the plurality of gate lines and the plurality of data lines;

a gate driving circuit including a plurality of stages directly formed on the display panel to output a plurality of output signals to the plurality of gate lines, in sequence, each of the plurality of stages comprising:

a driving part that outputs an output signal of a selected stage based on one of a start signal and an output signal of a previous stage, and a clock signal, the driving part including:

a first transistor connected to a first input terminal that receives one of the output signal of the previous stage and the start signal;

a second transistor connected to a clock signal line and an output terminal that outputs the output signal of the selected stage; and a third transistor connected to the output terminal an off-voltage terminal and a second input terminal that receives an output signal of a next stage to the selected stage; and a discharging part that discharges the output signal of the selected stage, the discharging part including:

a discharge transistor having a gate electrode that receives an output signal of a next stage to the selected stage; and an auxiliary transistor having a gate electrode that receives the output signal of the next stage, the auxiliary transistor being electrically connected in series to the discharge transistor; and a data driving circuit that applies a plurality of data signals to the plurality of data lines, wherein the third transistor receives the output signal at of the next stage simultaneously with a receipt of the output signal of the next stage by the discharge transistor.

16. The display device of claim 15, wherein the data driving circuit comprises a chip mounted on the display panel.

17. The display device of claim 15, further comprising a signal selecting circuit connected between the data driving circuit and the plurality of data lines to apply the plurality of data signals to the plurality of data lines based on primary data signals from the data driving circuit.

18. The display device of claim 17, wherein the signal selecting circuit is directly formed on the display panel.

* * * * *